(12) United States Patent
McCombs et al.

(10) Patent No.: US 8,767,495 B2
(45) Date of Patent: *Jul. 1, 2014

(54) MEMORY HAVING ISOLATION UNITS FOR ISOLATING STORAGE ARRAYS FROM A SHARED I/O DURING RETENTION MODE OPERATION

(71) Applicant: Apple Inc., Cupertino, CA (US)

(72) Inventors: Edward M. McCombs, Austin, TX (US); Daniel C. Chow, Austin, TX (US); Kenneth W. Jones, Austin, TX (US); Alexander E. Runas, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/029,989

(22) Filed: Sep. 18, 2013

(65) Prior Publication Data

US 2014/0016392 A1    Jan. 16, 2014

Related U.S. Application Data

(63) Continuation of application No. 13/356,786, filed on Jan. 24, 2012, now Pat. No. 8,570,824.

(51) Int. Cl.
*G11C 7/02*    (2006.01)

(52) U.S. Cl.
USPC .................. 365/207; 365/226; 365/189.11

(58) Field of Classification Search
USPC ................. 365/207, 226, 289.11, 154, 205
See application file for complete search history.

(56) References Cited

U.S. PATENT DOCUMENTS

| 6,166,942 | A  | * | 12/2000 | Vo et al. .......................... 365/63 |
| 7,180,774 | B2 | * | 2/2007  | Kobayashi et al. ...... 365/185.02 |
| 8,570,824 | B2 | * | 10/2013 | McCombs et al. ............ 365/207 |

* cited by examiner

*Primary Examiner* — David Lam
(74) *Attorney, Agent, or Firm* — Stephen J. Curran; Meyertons, Hood, Kivlin, Kowert & Goetzel, P.C.

(57) ABSTRACT

A memory includes an I/O unit that is shared between multiple storage arrays. The shared I/O unit provides output data from the arrays. The memory includes an isolation unit connected between each storage array and the shared I/O unit. In addition, each of the storage arrays and the shared I/O unit may be connected to a separate switched voltage domain through for example, power gating circuits. If one or more of the storage arrays is placed in retention or low-voltage mode, the isolation units that are coupled to the affected storage arrays may be configured to isolate the bitlines of those storage arrays from the shared I/O data paths.

20 Claims, 4 Drawing Sheets

US 8,767,495 B2

MEMORY HAVING ISOLATION UNITS FOR ISOLATING STORAGE ARRAYS FROM A SHARED I/O DURING RETENTION MODE OPERATION

PRIORITY INFORMATION

This application is a continuation application of U.S. patent application Ser. No. 13/356,786, filed Jan. 24, 2012, now U.S. Pat. No. 8,570,824, which is incorporated by reference herein in its entirety.

BACKGROUND

1. Technical Field

This disclosure relates to memories, and more particularly to shared memory I/O.

2. Description of the Related Art

Many memory devices include a number of storage arrays that share an input/output I/O circuit. For example, two or more arrays may share an I/O circuit that includes a sense amplifier. These storage arrays may often operate in voltage domains that are different from one another and which are also different than the voltage domain of the shared I/O. In many cases, the storage arrays and their associated circuits may be placed in retention mode when not being accessed to save power. When one of the arrays is in retention mode, the data outputs of that array may will be referenced at a different voltage than the array being accessed.

The voltage differences between the domains is typically handled using level shifters on the data paths from the array output to the sense amplifier. However, level shifters in the data path may in some cases cause additional signal delay because they are in the signal path, and thus the critical path. Furthermore, the level shifters may consume significant die area.

SUMMARY OF THE EMBODIMENTS

Various embodiments of a memory having isolation units for isolating a shared I/O from storage arrays are disclosed. Broadly speaking, a memory that includes an I/O unit that is shared between multiple storage arrays is contemplated. The shared I/O unit provides output data from the arrays. The memory includes a separate isolation unit connected between each storage array and the shared I/O unit. In addition, each of the storage arrays and the shared I/O unit may be connected to a separate switched voltage domain through for example, power gating circuits. If one or more of the storage arrays is placed in retention or low-voltage mode, the isolation units that are coupled to the affected storage arrays may be configured to isolate the bitlines of those storage arrays from the shared I/O data paths.

In one embodiment, the memory includes a number of storage arrays each configured to provide data on respective bitlines. The memory also includes an input/output (I/O) unit configured to output via data output signal paths, the data received from the storage arrays. The memory also includes a number of isolation units, each coupled to provide a data path between the respective bit lines of a corresponding respective storage array and the I/O unit when the corresponding respective storage array is operating in a normal operational mode. In response to a given storage array being placed in a low-voltage operational mode, the corresponding respective isolation unit is configured to isolate the respective bit lines from the I/O unit.

Figure 1:
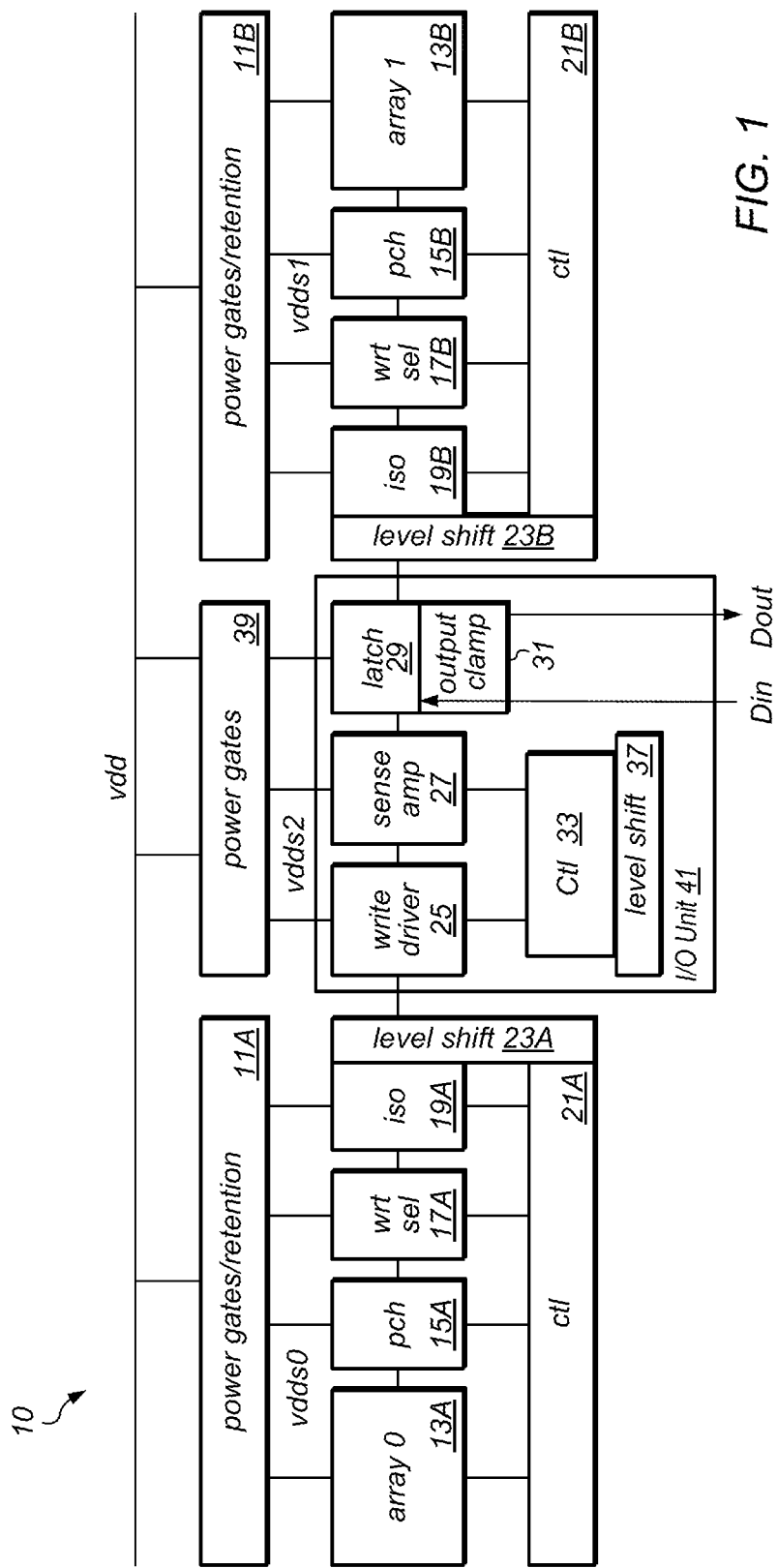
FIG. 1 is a block diagram of one embodiment of a memory.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of one embodiment of a memory is shown. The memory 10 includes a storage array 0, designated 13A, a storage array 1, designated 13B, and a shared input/output (I/O) unit 41. It is noted that components having a reference designator that includes both a number and a letter may be referred to using only the number where appropriate for simplicity.

In one embodiment, the shared I/O unit 41 may be configured to receive data on the Din data input and to control the writing of the data into one or both of the arrays 0 and 1. In addition, the shared I/O unit 41 may be configured to provide read data from the arrays 0 and 1 to the Dout data output.

As shown in FIG. 1, to support the array 0 13A various components are provided. More particularly, the power gates/ retention unit 11A may provide a switched voltage domain (e.g., vdds0) to the components associated with array 0. As such, the power gates/retention unit 11A may be configured to completely switch or gate off the unswitched Vdd power rail (also referred to as an always-on voltage domain) from the switched voltage domain vdds0, or the power gates/retention unit 11A may be configured to lower the voltage of the switched voltage domain to a retention voltage that may maintain the data in the array 0, when array 0 is inactive. In addition, a pre-charge circuit (e.g., pch 15A) may be used to precharge the bitlines (not shown) of the array 0, and the write select circuit (e.g., wrt sel 17A) may provide write control signals to the array 0. The isolation unit (e.g., iso 19A) in combination with the level shift logic 23A may be configured to isolate the array 0 when the array 1 is being accessed. Likewise, to support the array 1 13B various similar components are provided. For example, the power gates/retention unit 11B may provide another switched voltage domain (e.g., vdds1) to the components associated with array 1 as described above. In addition, the pre-charge circuit (e.g., pch 15B may be used to precharge the bitlines (not shown) of the array 1, and the write select circuit (e.g., wrt sel 17B) may provide write control signals to the array 1. The isolation unit (e.g., iso 19B) in combination with the level shift logic 23B may be configured to isolate the array 1 when the array 0 is being accessed. The control units (e.g., ctl 21A and ctl 21B) may be configured to control read and write operations to their respective arrays (e.g., 13A and 13B). The level shift logic 23A and 23b may also be used to accommodate voltage differences between the voltage domains vdds0, vdds1 and vdds2.

In addition, the shared I/O unit 41 operates on yet another switched voltage domain (e.g. vdds2), which is provided through power gates 39. As above, the power gates 39 may be configured to switch off the switched voltage domain vdds2 to power down the I/O unit 41. The I/O unit 41 includes a write driver 25 that may be configured to provide the drive current for writing data into array 0 or array 1. The sense amp 27 may be configured to sense the voltage differential on the bitlines of the array 0 or array 1 and provide for output a data signal that corresponds to the differential signal. The latch 29 may be configured to latch and output the data signals provided by the sense amp 27. The output clamp circuit 31 may be configured to clamp the Dout signal paths to a valid logic value when the I/O unit 41 is powered down by the power gates 39. The output clamp 31 may include clamping circuits with sufficient drive strength to drive the Dout signal paths to the valid logic levels. The control unit (e.g., ctl 33) may be configured to control read and write operations for the shared I/O unit 41. The level shift logic 37 may be used to accommodate voltage differences between the voltage domains vdds0, vdds1 and vdds2.

Figure 2:
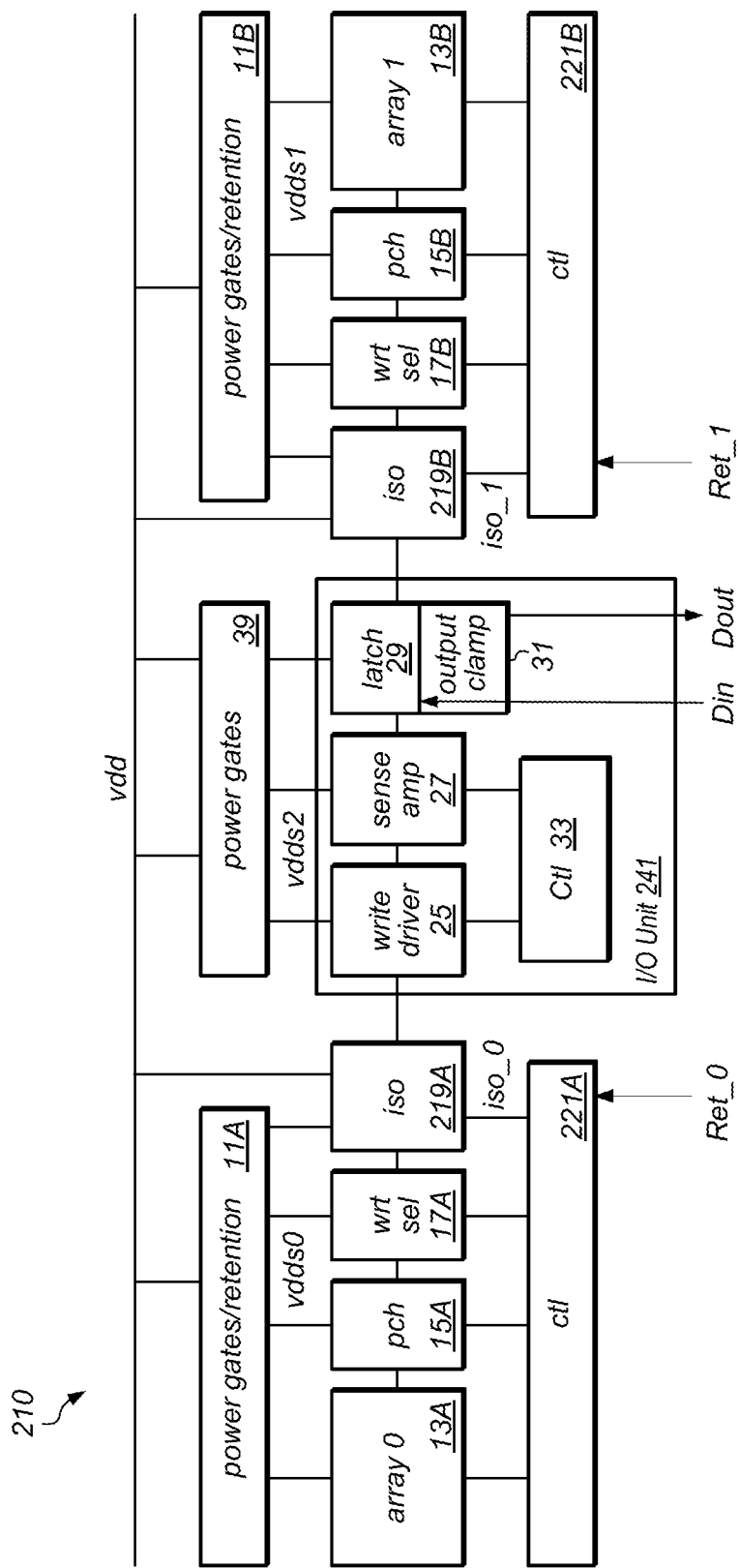
FIG. 2 is a block diagram of another embodiment of a memory having no level shifters.

Referring to FIG. 2, a block diagram of another embodiment of a memory is shown. Components shown in FIG. 2 that are the same as those shown in FIG. 1 are numbered identically for clarity. The memory 210 of FIG. 2 includes circuits that are similar to the circuits shown in memory 10 of FIG. 1 with a couple of notable exceptions. It is those exceptions that will be described in detail below in conjunction with FIG. 2. More particularly, the arrays 0 and 1 along with their respective associated circuits are similar to those shown in FIG. 1. Similarly, the write driver 25 and sense amp 27 are also similar. The power gates 39 are similar, but as shown, although the switched voltage domain vdds0 is coupled to the isolation unit 219A, isolation unit 219A is also coupled to the unswitched Vdd rail. In addition, as described further below, the isolation unit 219A includes isolation circuitry to isolate the array 0 from the sense amp 27 and the array 1 during retention mode. Lastly, the control unit 221A is different from the ctl 21A of FIG. 1 and is configured to receive a retention mode (e.g., Ret) indication and to provide an iso__0 indication to the isolation unit 219A.

In one embodiment, to save power one or both of the arrays 0 and 1 may be powered off or placed in retention mode during periods of inactivity. Retention or low-voltage mode typically refers to operating the memory arrays at a voltage that is less than the operating voltage. In many cases, the lower operating voltage is used to retain the data in the arrays, but the arrays are inactive. When operating one array in retention mode, it may be necessary to isolate the bitlines of the inactive array from the data lines of the sense amp 27 so that the outputs of the inactive array do not interfere with the outputs of the active array.

Accordingly, as described in greater detail below in conjunction with the description of FIG. 3, the isolation units 219A and 219B may be configured to isolate the bitlines of each inactive array from affecting data on the data paths of the sense amp.

Figure 3:
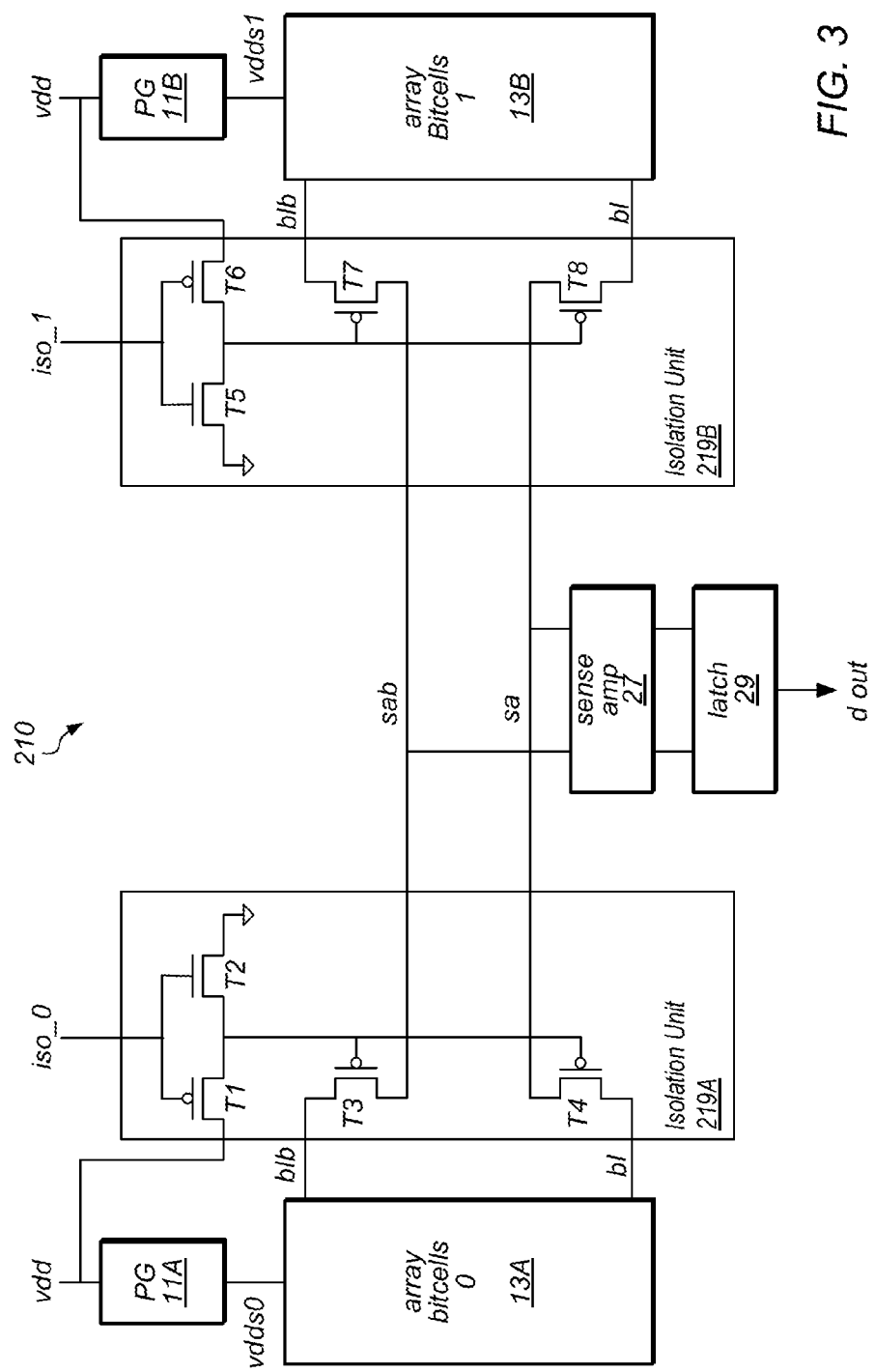
FIG. 3 is a schematic diagram illustrating additional details of the embodiment of the memory of FIG. 2.

Turning to FIG. 3, a schematic diagram illustration additional details of the embodiment of the memory of FIG. 2 are shown. Components shown in FIG. 3 that are the same as those shown in FIG. 2 are numbered identically for clarity. The memory 210 shown in FIG. 3 includes the power gate 11A coupled between the array 0 and the Vdd power rail which creates the vdds0 voltage domain. Similarly, the memory 210 includes the power gate 11B coupled between the array 1 and the Vdd power rail which creates the vdds1 voltage domain. Each of the arrays is coupled via data paths 'sa' and 'sab' to the sense amp 27, which is in turn coupled to the latch 29.

In addition, the memory 210 includes the isolation units 219A and 219B. The isolation unit 219A includes transistors T1 through T4, of which transistors T1 and T2 form an inverter. The gates of transistors T1 and T2 form the input of the inverter and it is coupled to receive the iso__0 signal. The inverter is coupled to the Vdd power rail and the circuit ground. Thus the inverter sources either the always-on (AON) unswitched Vdd power rail voltage or provides a sink to the circuit ground. The output of the inverter is coupled to the gate of transistors T3 and T4, which are p-type pass transistors. The transistor T3 is coupled between the 'b1b' bitline output of the array 0 and the data path sab of the sense amp 27. Similarly, the transistor T4 is coupled between the 'b1' bitline output of the array 0 and the data path sa of the sense amp 27. Likewise, the isolation unit 219B includes transistors T5 through T8, of which transistors T5 and T6 form an inverter. The gates of transistors T5 and T6 form the input of the inverter and it is coupled to receive the iso__1 signal. The inverter is coupled to the Vdd power rail and the circuit ground. Thus the inverter sources either the always-on Vdd power rail voltage or provides a sink to the circuit ground. The output of the inverter is coupled to the gate of transistors T7 and T8, which are also p-type pass transistors. The transistor T7 is coupled between the 'b1b' bitline output of the array 1 and the data path sab of the sense amp 27. Similarly, the transistor T8 is coupled between the 'b1' bitline output of the array 1 and the data path sa of the sense amp 27.

In one embodiment, during a normal operational mode, only one of array 0 or array 1 are active at a time. For example, if array 0 is active and array 1 is inactive the iso__0 signal is driven to a logic value of one, and the iso__1 signal may be driven to a logic value of zero. As such, transistor T2 is conducting which force the gates of transistors T3 and T4 to a logic value of zero. Thus transistors T3 and T4 are conducting and may pass whatever data may be output from the array 0. In contrast, since the iso_1 signal is driven to a logic value of zero, transistor T6 is conducting which force the gates of transistors T7 and T8 to a logic value of one. Thus transistors T7 and T8 are off and may block or isolate the 'b1' and 'b1b' lines of array 1 from being in contention with the output of the array 0. The converse is true when array 1 is active and array 0 is inactive.

This allows the arrays to share the 'sa' and 'sab' lines without colliding the data from the arrays. In one implementation, tri-state drivers (not shown) within each array may drive read data onto their respective bitlines when the respective array is active. For example, when array 0 is being accessed, then the tri-state drives of array 1 ay be held in a tri-state condition.

However, when one of the arrays is placed into retention mode, in one embodiment, the power gate 11A or 11B may lower the voltage in the respective voltage domain (e.g., vdds0 or vdds1). However, the voltage domain of the sense amp 27 may remain at the nominal operating voltage. Thus, to prevent voltage differentials on the data paths of the sense amp 27, the iso_0 or iso_1 signal is placed at a logic level of zero by, for example, the control unit 221A or 221B, respectively. This causes a logic level of one to be applied to the gates of the pass transistors (e.g., T3 and T4, or T7 and T8) of the corresponding isolation unit. It is noted that the Vdd power rail is a reliable voltage that is always on unless power is completely removed from the memory 210. Thus, the pass transistors may be turned off reliably to isolate the respective array bitlines from the sense amp data paths when one of the arrays is in retention mode.

It is noted that the bitlines of the arrays 0 and 1, and the circuits within the isolation units 219A and 219B of FIG. 3 represent only one slice or bit of data of possibly a multi-bit data path. Accordingly, in other embodiments, the memory 210 may include as many of the circuits shown in FIG. 3 as there are data bits in the data path.

Figure 4:
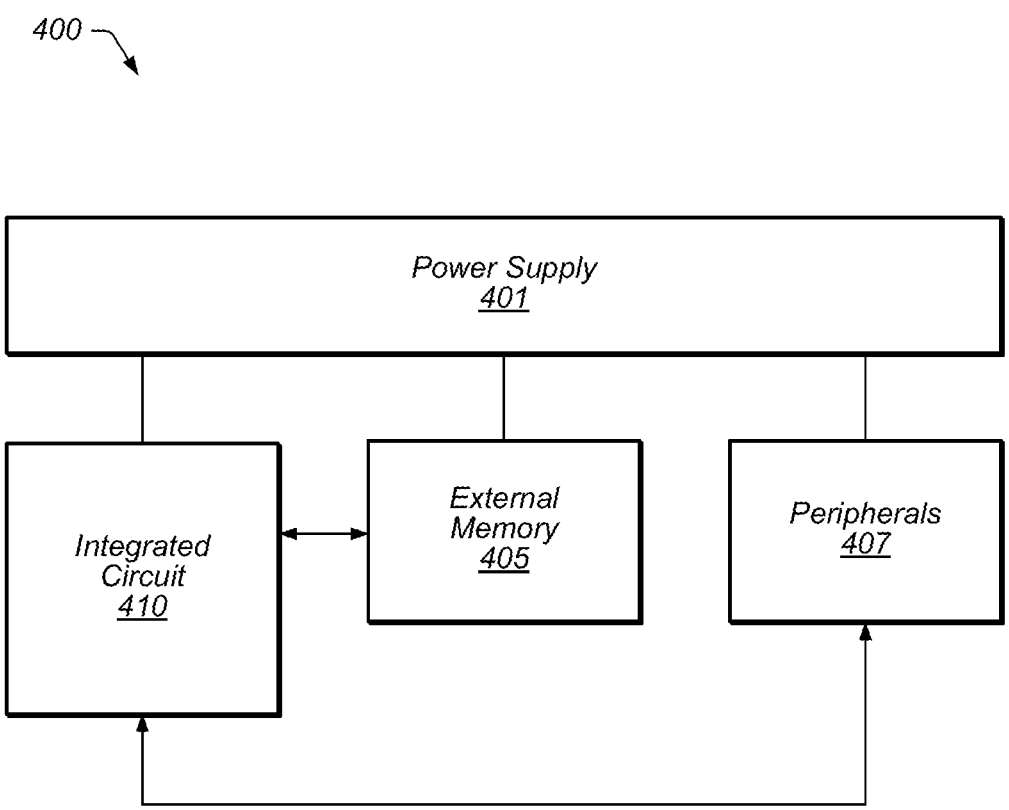
FIG. 4 is a block diagram of one embodiment of a system.

Referring to FIG. 4, a block diagram of one embodiment of a system is shown. The system 400 includes at least one instance of an integrated circuit 410 coupled to one or more peripherals 407 and an external system memory 405. The system 400 also includes a power supply 401 that may provide one or more supply voltages to the integrated circuit 410 as well as one or more supply voltages to the memory 405 and/or the peripherals 407.

In one embodiment, the integrated circuit 410 may be a system on a chip (SOC) including one or more instances of a processor, and various other circuitry such as a memory controller, video and/or audio processing circuitry, on-chip peripherals and/or peripheral interfaces to couple to off-chip peripherals, etc. Accordingly, the integrated circuit 410 may include one or more instances of an embedded memory such as memory 210 of FIG. 2. Thus, embodiments that include the memory 210 may also include isolation units such as isolation units 219A and 219B of FIG. 3.

The peripherals 407 may include any desired circuitry, depending on the type of system. For example, in one embodiment, the system 400 may be included in a mobile device (e.g., personal digital assistant (PDA), smart phone, etc.) and the peripherals 407 may include devices for various types of wireless communication, such as WiFi, Bluetooth, cellular, global positioning system, etc. The peripherals 407 may also include additional storage, including various types of RAM storage, solid-state storage, or disk storage. As such, the peripherals 407 may also include RAM that includes a shared I/O unit and isolation units 219A and 219B as described above in conjunction with the description of FIG. 2 and FIG. 3. The peripherals 407 may include user interface devices such as a display screen, including touch display screens or multitouch display screens, keyboard or other input devices, microphones, speakers, etc. In other embodiments, the system 400 may be included in any type of computing system (e.g. desktop personal computer, laptop, workstation, net top etc.).

The external system memory 405 may be representative of any type of memory. For example, the external memory 405 may be in the DRAM family such as synchronous DRAM (SDRAM), double data rate (DDR, DDR2, DDR3, etc.), or any low power version thereof. However, external memory 405 may also be implemented in SDRAM, static RAM (SRAM), or other types of RAM, etc. Accordingly, external system memory 405 may also include a shared I/O unit and isolation units 219A and 219B as described above in conjunction with the description of FIG. 2 and FIG. 3.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A memory comprising:
a plurality of storage arrays each configured to provide data on a respective plurality of bit lines;
a plurality of isolation units, each coupled to provide a data path between the respective plurality of bit lines of a corresponding respective one of the plurality of storage arrays and a plurality of data output signal paths when the corresponding respective storage array is operating in a normal operational mode;
wherein in response to a given storage array of the plurality of storage arrays being placed in a low-voltage operational mode in which the given array is operated at a voltage that is less than a normal operating voltage, the corresponding respective isolation unit is configured to isolate the respective plurality of bit lines from the plurality of data output signal paths.

2. The memory as recited in claim 1, wherein each bitline of each plurality of bit lines comprises a differential bit line pair, and wherein each isolation unit comprises a plurality of pass transistor pairs, each pass transistor of a pass transistor pair is coupled to a respective bit line of the differential bit line pair.

3. The memory as recited in claim 2, further comprising an input/output (I/O) unit configured to output via the plurality of data output signal paths, the data received from the plurality of storage arrays.

4. The memory as recited in claim 3, wherein each isolation unit includes an inverter, wherein an output of the inverter is coupled to the plurality of pass transistor pairs, wherein the inverter is coupled between an unswitched voltage supply and a circuit ground reference.

5. The memory as recited in claim 4, wherein in response to an isolation signal, the inverter is configured to turn off the pass transistors, thereby isolating each differential bit line pair from the I/O unit.

6. The memory as recited in claim 5, wherein the isolation signal indication indicates that the corresponding storage array is being placed into the low voltage operational mode, wherein the low voltage operational mode corresponds to a state in which an operating voltage is lowered from a normal operating voltage level to a retention voltage level that allows data in the corresponding storage array to be maintained and in which there are no memory accesses.

7. The memory as recited in claim 2, wherein each pass transistor comprises a p-type transistor.

8. A memory comprising:
a first storage array configured to provide first data on a first plurality of bit lines;
a second storage array configured to provide second data on a second plurality of bit lines;
a first isolation unit coupled to provide a data path between the first plurality of bit lines and a plurality of data output signal paths when the first storage array is operating in a normal operational mode;
a second isolation circuit coupled to provide a data path between the second plurality of bit lines and the plurality of data output signal paths when the second storage array is operating in the normal operational mode;
wherein in response to the first storage array being placed in a low-voltage operational mode in which the first array is operated at a voltage that is less than a normal operating voltage, the first isolation unit is configured to isolate the first plurality of bit lines from the plurality of data output signal paths.

9. The memory as recited in claim 8, wherein in response to the second storage array being placed in a low-voltage operational mode, the second isolation unit is configured to isolate the second plurality of bit lines from the plurality of data output signal paths.

10. The memory as recited in claim 8, wherein each bitline of each of the first and the second plurality of bit lines comprises a differential bit line pair, and wherein each isolation unit comprises a plurality of pass transistor pairs, each pass transistor of a pass transistor pair is coupled to a respective bit line of the differential bit line pair.

11. The memory as recited in claim 10, wherein each isolation unit further comprises a an inverter coupled between an unswitched voltage supply and a circuit ground reference, and, wherein an output of the inverter is coupled to each pass transistor.

12. The memory as recited in claim 11, wherein in response to an isolation signal, the inverter is configured to couple the unswitched voltage supply to a gate terminal of each pass transistor to turn off each pass transistor, thereby isolating each differential bit line pair from the plurality of data output signal paths.

13. The memory as recited in claim 10, wherein each pass transistor is series connected between a bitline and a data path of the plurality of data output signal paths.

14. The memory as recited in claim 8, further comprising an input/output (I/O) unit including a plurality of sense amplifiers, each coupled to a differential bit line pair and configured to output data received from the first storage array and the second storage array.

15. An integrated circuit comprising:
a memory;
an unswitched power rail configured to provide power to an unswitched voltage domain while is applied to the integrated circuit; and
a plurality of power gating circuits coupled to the unswitched power rail and configured to provide a plurality of switched voltage domains;
wherein the memory includes:
a plurality of storage arrays each coupled to a respective switched voltage domain and configured to provide data on a respective plurality of bit lines;
a plurality of isolation units, each coupled to the unswitched voltage domain and configured to provide a data path between the respective plurality of bit lines of a corresponding respective one of the plurality of storage arrays and a plurality of data output signal paths when the corresponding respective storage array is operating in a normal operational mode;
wherein in response to a given storage array of the plurality of storage arrays being placed in a low-voltage operational mode, the corresponding respective isolation unit is configured to isolate the respective plurality of bit lines from the plurality of data output signal paths.

16. The integrated circuit as recited in claim 15, wherein in response to the given storage array being placed in the low-voltage operational mode the respective switched voltage domain voltage is lowered, and a control signal indicative of the low-voltage operational mode is provided to the corresponding respective isolation unit.

17. The integrated circuit as recited in claim 15, wherein each isolation unit includes a respective pass transistor for each bitline, wherein each respective pass transistor is series connected between the bitline and the plurality of data output signal paths.

18. The integrated circuit as recited in claim 17, wherein each isolation unit further includes an inverter that is powered by one of the switched voltage domains and a circuit ground reference, and wherein the inverter is configured to turn off the pass transistors in response to a control signal, thereby isolating each bitline of the respective plurality of bitlines from the plurality of data output signal paths.

19. The integrated circuit as recited in claim 18, wherein in response to the control signal, the inverter is configured to couple a voltage of the unswitched voltage supply to a gate terminal of each pass transistor to turn off each pass transistor, thereby isolating each differential bit line pair from the plurality of data output signal paths.

20. The integrated circuit as recited in claim 17, wherein each pass transistor comprises a p-type transistor.

* * * * *

UNITED STATES PATENT AND TRADEMARK OFFICE
CERTIFICATE OF CORRECTION

PATENT NO. : 8,767,495 B2
APPLICATION NO. : 14/029989
DATED : July 1, 2014
INVENTOR(S) : Edward M. McCombs et al.

Page 1 of 1

It is certified that error appears in the above-identified patent and that said Letters Patent is hereby corrected as shown below:

In the Claims:

Claim 11, Column 7, Line 34, delete "a an" and insert -- an --

Claim 15, Column 8, Line 4, delete "while is" and substitute -- while --

Signed and Sealed this
Thirtieth Day of September, 2014

Michelle K. Lee
*Deputy Director of the United States Patent and Trademark Office*